(12) United States Patent
Lettow et al.

(10) Patent No.: US 10,433,444 B2
(45) Date of Patent: Oct. 1, 2019

(54) INTERCONNECT DEVICE

(71) Applicant: VORBECK MATERIALS, Jessup, MD (US)

(72) Inventors: John S Lettow, Washington, DC (US); Louise Brooks, Washington, DC (US); Paige J Boehmcke, Baltimore, MD (US); Bretton Swope, Gaithersburg, MD (US); Robyn Nariyoshi, Honolulu, HI (US)

(*) Notice: Subject to any disclaimer, the term of this patent is extended or adjusted under 35 U.S.C. 154(b) by 0 days.

(21) Appl. No.: 16/275,291

(22) Filed: May 6, 2019

(65) Prior Publication Data
US 2019/0254186 A1    Aug. 15, 2019

Related U.S. Application Data (63) Continuation of application No. 15/487,429, filed on Apr. 13, 2017.

(51) Int. Cl.
| | |
|---|---|
| *H05K 5/00* | (2006.01) |
| *H05K 5/02* | (2006.01) |
| *H05K 1/02* | (2006.01) |
| *H01Q 1/27* | (2006.01) |

(52) U.S. Cl.
CPC ......... *H05K 5/0247* (2013.01); *H01Q 1/273* (2013.01); *H05K 1/028* (2013.01); *H05K 5/0008* (2013.01); *H05K 5/0013* (2013.01); *H05K 2201/09036* (2013.01)

(58) Field of Classification Search
CPC .. H05K 5/0247; H05K 5/0008; H05K 5/0013; H05K 1/028; H05K 2201/0999; H05K 2201/09754; H05K 2201/09036; H01Q 1/273; H01R 12/592; H01R 12/78; H01R 13/627; H01R 13/6277; H01R 13/2442; H01R 13/2492; H01R 4/646
USPC ...... 361/749; 439/44, 47, 48, 49, 50, 51, 52, 439/53, 65, 67, 77
See application file for complete search history.

(56) References Cited

U.S. PATENT DOCUMENTS

| | | | |
|---|---|---|---|
| 6,929,487 B1* | 8/2005 | Raghavendra ..... | H01R 13/6658 439/654 |
| 2004/0209396 A1* | 10/2004 | Krulevitch ........... | A61N 1/0452 438/106 |
| 2005/0054941 A1* | 3/2005 | Ting ..................... | A61B 5/0408 600/529 |

(Continued)

*Primary Examiner* — Roshn K Varghese
(74) *Attorney, Agent, or Firm* — Trentice Y. Bolar, Esq.

(57) ABSTRACT

Generally speaking, pursuant to various embodiments, interconnect apparatuses are provided herein to couple flexible circuits to control circuits. In some embodiments, the apparatus can comprise a first portion housing a control circuit and a second portion conductively coupled to a flexible circuit. The second portion can comprise a first seat housing and a second seat housing, which together can form a housing around the flexible circuit. The control circuit can conductively couple to the flexible circuit when the first portion couples to the second portion. The flexible circuit can be included in an apparel item and comprise a conductive trace. The conductive trace can comprise a conductive composition. The first seat housing can comprise a lateral wall and a flange extending peripherally from the lateral wall. The flange can comprise a longitudinal co-extensive lateral recess flanking the flexible circuit.

14 Claims, 9 Drawing Sheets

(56) References Cited

U.S. PATENT DOCUMENTS

2007/0105404 A1* 5/2007 Lee .................. H01R 12/592
                                              439/37
2013/0033810 A1* 2/2013 Crain ................ C09D 7/70
                                              361/679.32
2013/0323946 A1* 12/2013 Ritner ............... H01R 12/771
                                              439/83

* cited by examiner

INTERCONNECT DEVICE

CROSS-REFERENCE TO RELATED APPLICATIONS

This application is a continuation of U.S. patent application Ser. No. 15/487,429, filed Apr. 13, 2017, which claims priority to U.S. Provisional Application No. 62/322,136, filed Apr. 13, 2016. Both applications are hereby incorporated herein by reference in their entirety.

TECHNICAL FIELD

Background

The present invention relates generally to interconnect devices. Interconnects are typically structures that are configured to conductively couple two or more separate devices together. Flexible circuits can be configured to include one or more insulating materials upon which one or more conductive circuit patterns may be applied (e.g., formed by etching metal foil cladding from polymer bases, plating metal or printing of conductive inks). For example, flexible circuits may or may not have electrical components attached thereto. A protective coating may be applied to one or more surfaces of the flexible circuits (e.g., to reduce or eliminate the effects of impacts and/or climate conditions).

DETAILED DESCRIPTION

The descriptions of the various embodiments are presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Certain terminology may be employed in the following description for convenience rather than for any limiting purpose. For example, the terms "forward" and "rearward," "front" and "rear," "right" and "left," "upper" and "lower," and "top" and "bottom" designate directions in the drawings to which reference is made, with the terms "inward," "inner," "interior," or "inboard" and "outward," "outer," "exterior," or "outboard" referring, respectively, to directions toward and away from the center of the referenced element, the terms "radial" or "horizontal" and "axial" or "vertical" referring, respectively, to directions or planes which are perpendicular, in the case of radial or horizontal, or parallel, in the case of axial or vertical, to the longitudinal central axis of the referenced element, and the terms "downstream" and "upstream" referring, respectively, to directions in and opposite that of fluid flow. Terminology of similar import other than the words specifically mentioned above likewise is to be considered as being used for purposes of convenience rather than in any limiting sense.

Generally speaking, pursuant to various embodiments, interconnect apparatuses are provided herein to couple flexible circuits to control circuits. In some embodiments, the apparatus can include a first portion housing one or more control circuits and a second portion conductively coupled to a flexible circuit. In some embodiments, the first portion may be configured to be coupled to the second portion such that the control circuit can be conductively coupled to the flexible circuit when the first portion is coupled to the second portion. In some embodiments, the control circuit can be configured to capture temperature readings. In some embodiments, the control circuit can be configured to capture proximity readings. In some embodiments, the control circuit can be configured to include one or more communications devices.

In some embodiments, the flexible circuit can be configured to comprise one or more conductive traces conductively coupled to one or more antenna elements. In some embodiments, the control circuit can be configured to include one or more antenna elements. In some embodiments, at least one of the first portion and the second portion can be configured to include PET, PE, Kapton, and/or PVC. In some embodiments, the first portion and the second portion can be configured to include a first orienting element and a second orienting element, respectively, wherein the first orienting element and the second orienting element can be configured to engage each other and thereby couple the first portion to the second portion.

In some embodiments, the first portion and the second portion can be configured to be coupled together via a snap action. In some embodiments, the first portion can be configured to be selectively coupled to the second portion. Interconnects are typically structures that are configured to conductively couple two or more separate devices together. Flexible circuits can be configured to include one or more insulating materials upon which one or more conductive circuit patterns may be applied (e.g., formed by etching metal foil cladding from polymer bases, plating metal or printing of conductive inks). For example, flexible circuits may have one or more electrical components attached thereto (e.g., control circuits, energy storage devices, information stores, communications units, antennas, similar electrical components, or a combination of two or more thereof). A protective coating may be applied to one or more surfaces of the flexible circuits (e.g., to reduce or eliminate the effects of impacts and/or climate conditions experienced by the flexible circuit). For example, the flexible circuits can be included in an apparel item worn (i.e. a wearable computing device) by a human or other mammal (e.g., dog, cat, horse, bovine, similar mammals).

In some embodiments, the interconnects disclosed herein are configured to establish a plurality of conductive couplings between control circuits and flexible circuits. As used herein, "control circuit" refers to an electronic device that can include one or more individual electronic components (e.g., resistors, transistors, capacitors, inductors, diodes, antennas, similar electronic components, or a combination of two or more thereof) conductively coupled to at least one conductive trace (e.g., wires, printed circuits, painted circuits, similar conductive paths.).

In some embodiments, the conductive traces can be formed using a conductive composition. For example, the conductive composition can include one or more of fully exfoliated single sheets of graphite (i.e. graphene sheets), metals (e.g., silver, copper, gold, zinc, carbon black, brass, similar metals, or a combination of two or more thereof), graphite, carbon nanotubes, or a combination of two or more thereof. The conductive composition can include one or more conductive polymers. In general, the conductive composition can comprise any conductive material, in accordance with some embodiments.

In some embodiments, the conductive trace can be applied to the surface of a substrate using a printing technique. In some embodiments, the substrate can include one or more polymers, for example, PET, PE, polyimides, PVC, and/or similar non-electrically conductive polymers (i.e. electrically insulating polymers) that can maintain structural integrity during application of electricity to the conductive traces. In some embodiments, the conductive traces can include etched metals (e.g., copper, silver, aluminum, zinc, gold, brass, similar metals, or a combination of two or more thereof). Conductive traces can include sheet metal that is applied to the substrate surface.

Referring now to FIGS. 1-4. In some embodiments, the interconnect (e.g., interconnect 500) can comprise a first portion 100 and a second portion 300, wherein the second portion can be conductively coupled to and in direct communication with a flexible circuit 330. In some embodiments, at least one of the below discussed components of the first portion 100, the second portion 300, the first portion 600, and the second portion 800 can each be fabricated by injection molding, low pressure injection molding, additive fabrication, similar fabrication methods, or a combination of two or more thereof. In some embodiments, the first portion 100 can include a support plate 122 that is configured to receive a housing shell 110 such that when joined together form a void into which control circuit 130 can be positioned. The housing shell 110 can be configured to be a hollow structure having a circumference that is approximate to the circumference of the support plate 122. In some embodiments, the housing shell 110 can have an outwardly convexed top surface (e.g., a curved, domed, or flat top) that is supported by a lateral wall extending from the periphery of the top surface.

Figure 1:
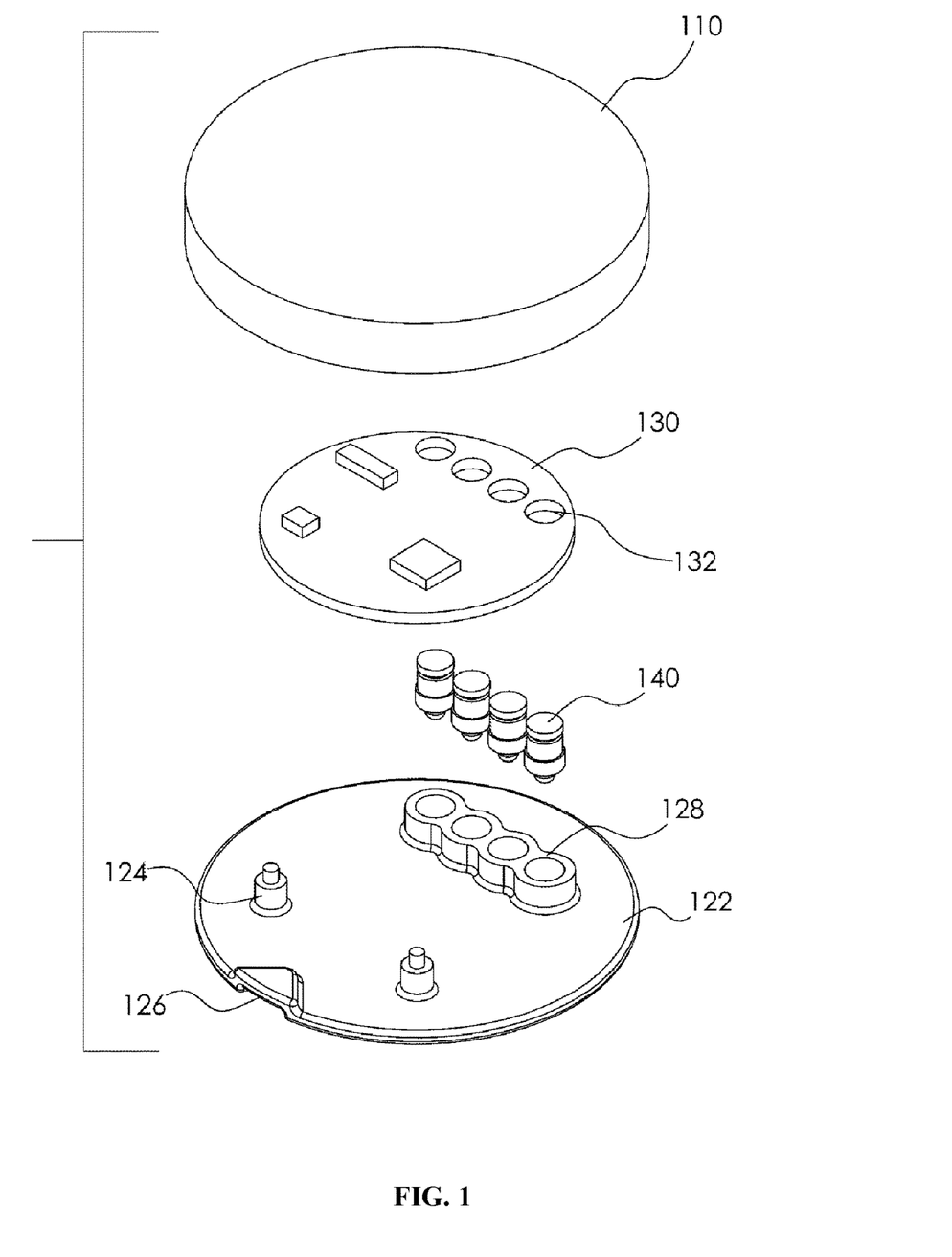
FIG. 1 illustrates an interconnect, in accordance with some embodiments.
Figure 2:
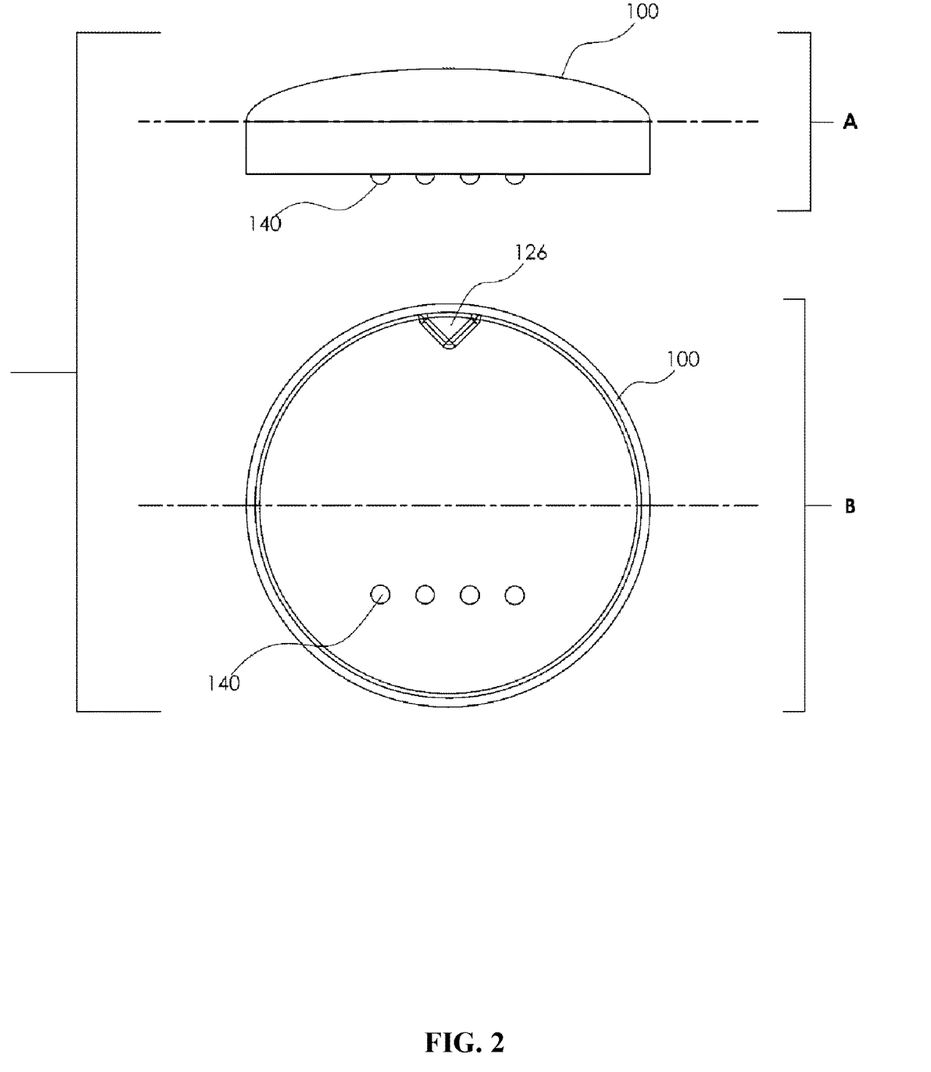
FIG. 2 illustrates an interconnect, in accordance with some embodiments.

In some embodiments, the support plate 122 can be configured as a substantially planar surface having support structures 124, conduits 128, and interengaging notch 126 each extending vertically therefrom. In some embodiments, support structures 124 and conduits 128 together can provide resting support for the control circuit 130. In some embodiments, support structures 124 and conduits 128 together provide a uniform height sufficient to provide a void between the control circuit 130 and the support plate 122. For example, the void can provide a pocket of air beneath the control circuit 130 that can facilitate cooling (e.g., reduce or inhibit heat buildup) of the control circuit 130 and keep the unit within operational parameters. In some embodiments, the support plate 122 can be configured to have a circumference that compliments that of the housing shell 110 (e.g., a disc configuration).

In embodiments, the conduits 128 can extend laterally in a region of the support plate 122 opposing the region that include the support structures 124. In some embodiments, each conduit 128 shares a wall with the conduit 128 positioned adjacent thereto. For example, the walls each have a circumference greater than that of an opening 132. In some embodiments, the control circuit 130 can be configured to include a plurality of openings 132 that are voids configured to have a circumference that accepts the conducting elements 140 such that the each conducting element 140 can rest flush with the inner wall of the respective opening 132 (e.g., to facilitate conductive communication therebetween).

For example, each opening 132 and conduit 128 can be configured to accept (i.e., has complementary structures with) a respective conducting element 140. Openings 132 and conduits 128 can each have structures that are complementary to a respective conducting element 140. Each conductive element 140 can be configured to be conductively coupled to the control circuit 130 upon insertion in to a respective opening 132. In some embodiments, conducting elements 140 can each have a cylindrical body with a top surface and a bottom surface. For example, the bottom surface can be configured to have a convexed, conical, pointed, or similar protruding structure configured to contact a respective conductive trace 335 (discussed further below).

FIGS. 2A-2B illustrate a side and a bottom view of the first portion 100, respectively. Specifically, FIG. 2A depicts conducting elements 140 extending beyond the bottom surface of the support plate 122. Rotating clockwise 90° along the dotted line axis, FIG. 2B depicts the bottom surface of the support plate 122 where interengaging notch 126 is positioned along the top periphery thereof and conducting elements 140 are laterally positioned in the bottom region thereof.

Figure 3:
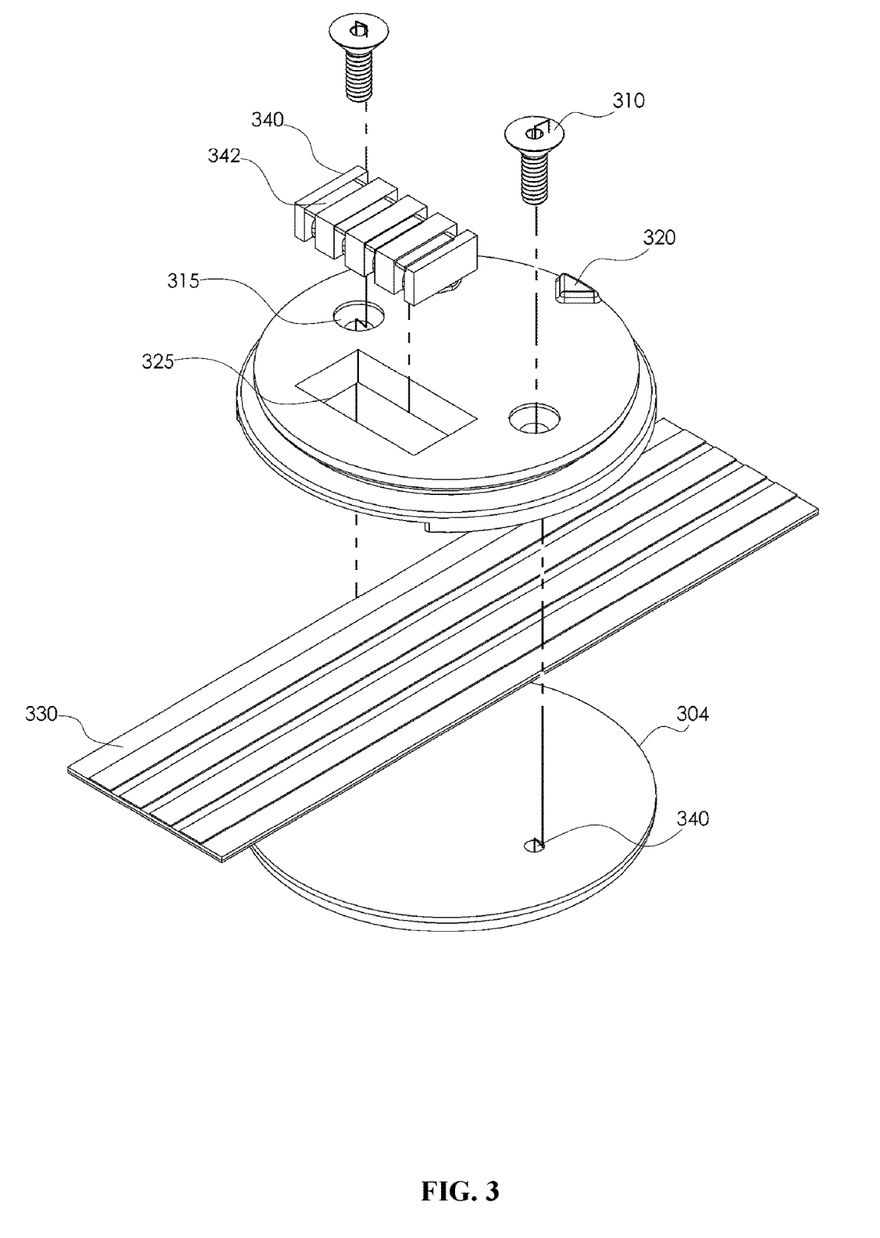
FIG. 3 illustrates an interconnect, in accordance with some embodiments.

Referring now to FIG. 3. In some embodiments, the second portion 300 can be a seat assembly configured to couple to the first portion 100. For example, the second portion 300 can be a structure configured to facilitate conductive communication between the flexible circuit 330 and the control circuit 130 via selective coupling with the first portion 100. In some embodiments, the second portion 300 can include a first seat housing 302 and a second seat housing 304 configured such that when coupled together (e.g., via fasteners 310) they form a housing around a portion of the flexible circuit 330. In some embodiments, the second portion 300 can be configured to receive the first portion 100. For example, the first seat housing 302 can include a substantially planar top surface having a lip/flange that extends peripherally from the lateral walls of the top surface and having a width sufficient to allow the first portion 100 to rest upon when coupled to the second portion 300. In some embodiments, the lip can include adjacent longitudinal co-extensive lateral recesses configured to flank the conductive trace 335.

In some embodiments, the top surface of the first seat housing 302 can include an interengaging notch 320 configured to engage interengaging notch 126 and thereby orient the first portion 100 in a particular direction relative to the second portion 300 when the first portion 100 and the second portion 300 are coupled together. For example, interengaging notches 126 and 320 can each include a magnet member affixed to an underside thereof and configured to engage each other such that the first portion 100 and the second portion 300 are coupled together as a result of the magnetic engagement.

The first seat housing 302 can be affixed to the second seat housing 304 via fasteners 310. For example, a fastener 310 can be a screw (e.g., a fastener with a spirally grooved shaft) configured to be inserted through a respective aperture 315 and frictionally engage a respective passage 340 to embed a portion of itself in the passage. In some embodiments, the first seat housing 302 can be configured to include an opening 325 positioned on the top surface of the first seat housing in a region opposing the interengaging notch 320 and adjacent to apertures 315. The opening 325 can completely extend through the top surface to expose a portion of the flexible circuit 330 when the first seat housing 302 and the second seat housing 304 are coupled together via fasteners 310. Opening 325 can be configured to receive conducting elements 340.

Figure 4:
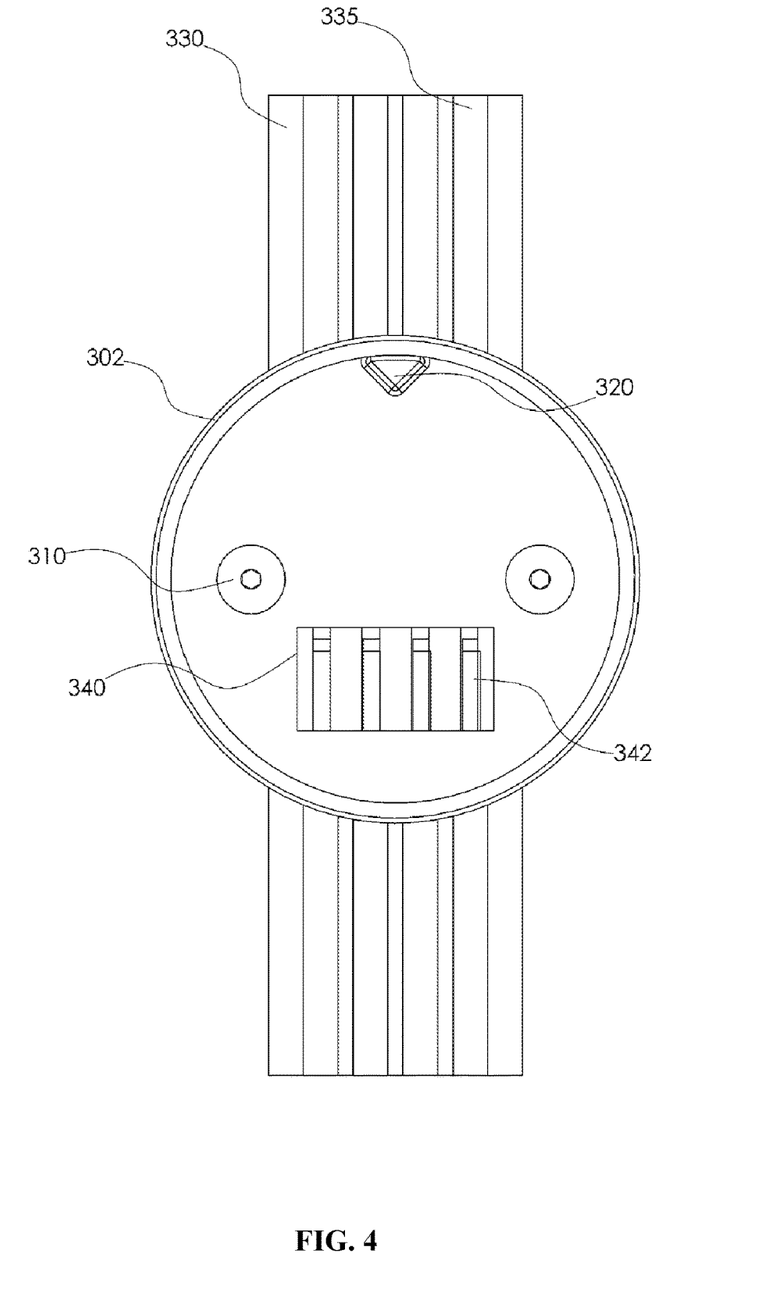
FIG. 4 illustrates an interconnect, in accordance with some embodiments.

The opening 325 can be configured to orient the guide 340 such that each of the conducting elements 342 are conductively coupled to a respective conductive trace 335. In some embodiments, the guide 340 can be configured to have an overall structure that complements the shape of the opening 325 (e.g., block, rectangular, similar shapes, etc.). The guide 340 can be configured to have several channels (e.g., grooves, slits, cavities, slots, etc.) that each run across each longitudinal surface of the guide 340. Each conducting element 342 can be configured to sit in a respective channel of the guide 340 such that the conducting element 342 can contact a respective conductive trace 335 when the guide 340 engages the opening 325 and can contact a respective conducting element 140 when the first portion 100 is coupled to the second portion 300. FIG. 4 illustrates a top view of an assembled second portion 300. Specifically, FIG. 4 illustrates that each conducting element 342 is aligned relative to a respective conductive trace 335.

Figure 5:
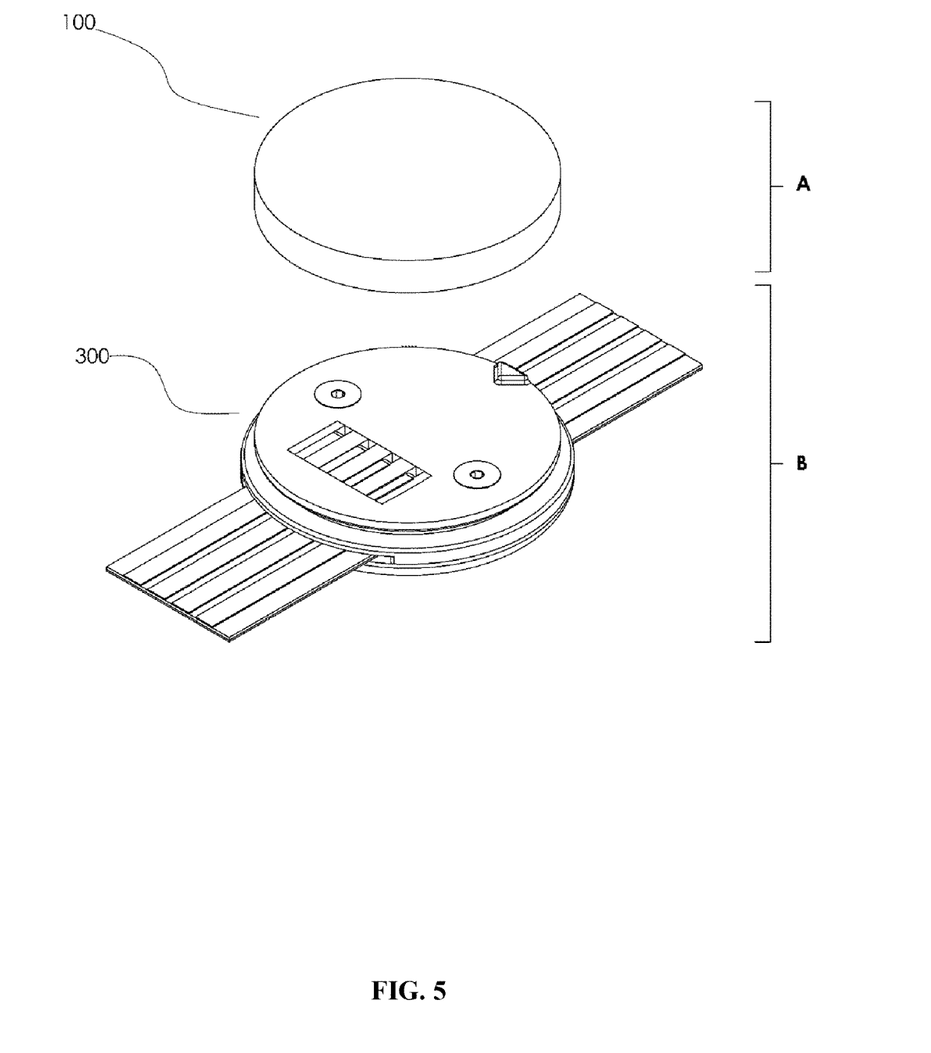
FIG. 5 illustrates an interconnect, in accordance with some embodiments.

FIG. 5 illustrates the manner in which the first portion 100 can engage the second portion 300, in accordance with some embodiments. Referring now to FIGS. 6-9. Specifically, FIGS. 6-9 depict interconnect 900, which is configured to be at least partially assembled via a snap action. In some embodiments, the interconnect 900 can include first portion 600 and second portion 800, which can be configured to be coupled together via a snap motion. The first portion 600 can be configured to include housing shell 610. In some embodiments, housing shell 610 can be configured as shell structure that can provide a protective covering for at least one of the control circuit 130, the conductive elements 140, and the support plate 620. For example, housing shell 610 can be configured to have at least two coupling elements 612 extending from opposing sides of the housing shell 610. Coupling elements 612 can each be configured as a continuous structure of the housing shell 610.

Figure 6:
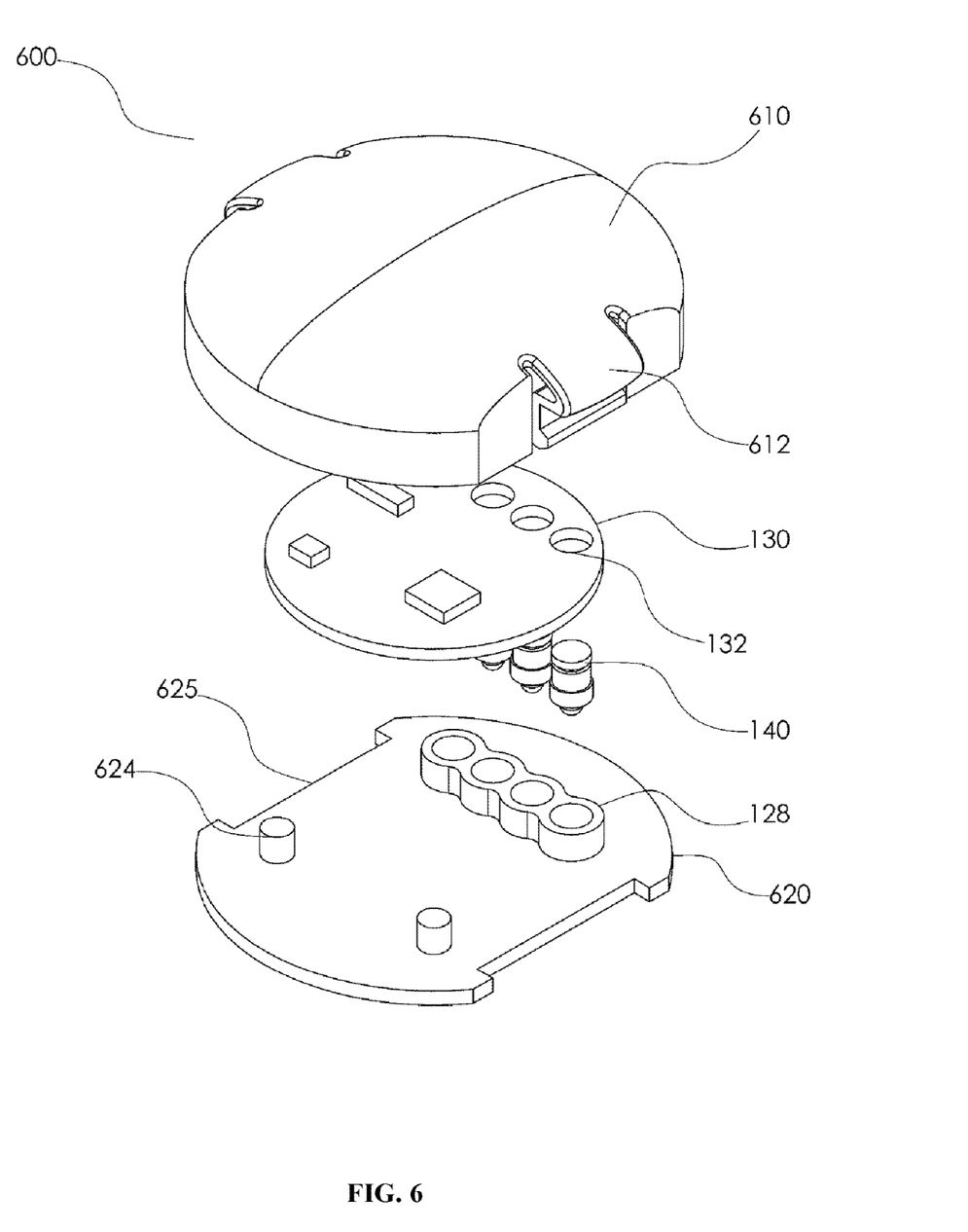
FIG. 6 illustrates an interconnect, in accordance with some embodiments.

In some embodiments, each coupling element 612 can be configured as a latch having a shelf spaced laterally inward from the lateral wall of the housing shell 610 and forming a front-to-rear gap therebetween. For example, the shelf can be configured to receive the support plate 620. In some embodiments, the coupling elements 612 can be configured to couple the support plate 620 to the housing shell 610 via a snap action such that the support plate 620 rests on the shelf of each respective coupling element 612. The first portion 600 and the second portion 800 can be configured to be coupled together via the coupling elements 612 (e.g., via a snap action provided via the coupling elements engaging the ribs 830). In some embodiments, the support plate 620 can be configured to include indentations 625 positioned on opposing sides of the support plate 620 and each having two ends such that each indentation 625 is positioned adjacent to the conduits 128 at one end and support structures 624 at the other end.

Figure 7:
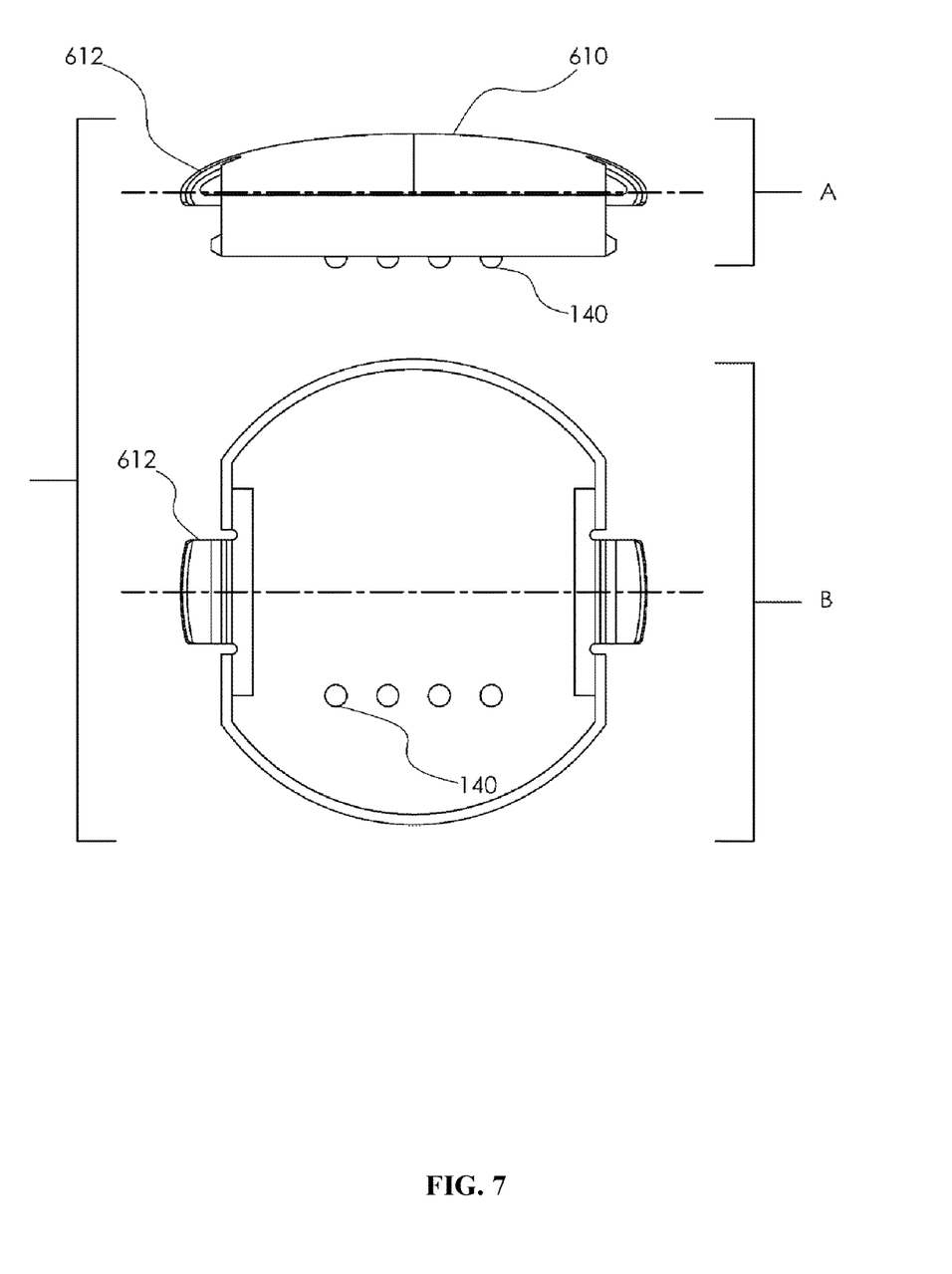
FIG. 7 illustrates an interconnect, in accordance with some embodiments.

Each indentation 625 can be configured to rest on the shelf formed on the inner surface of a coupling element 612 when the support plate 620 is coupled to the housing shell 610. In some embodiments, the support plate 620 can be configured to include conduits 128 (discussed above) and support structures 624. For example, support structures 624 can be configured to perform similar structural functionalities as support structures 124 (discussed above). Support plate 620 can be configured to have an overall shape that complements the shape of housing shell 610. Referring now to FIG. 7. FIGS. 7A, 7B, and 7C illustrate a top view, side view, and bottom view of an assembled version of the first portion 600.

Figure 8:
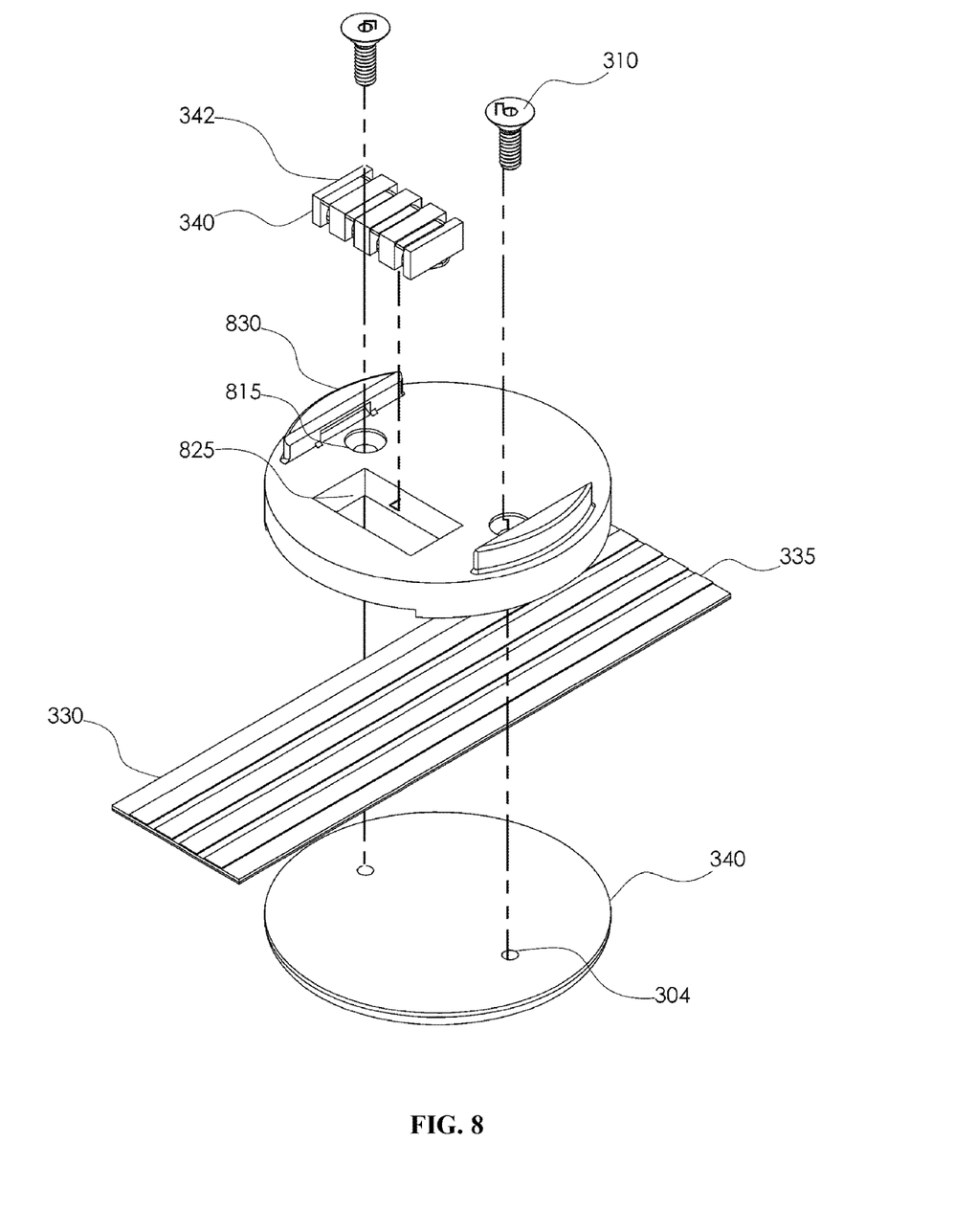
FIG. 8 illustrates an interconnect, in accordance with some embodiments.

In some embodiments, the second portion 800 can be a seat assembly configured to couple to the first portion 600 (e.g., via the snap action discussed above). In some embodiments, the second portion 800 can include a first seat housing 802 configured to be coupled to the second seat housing 304 (e.g., via each fastener 310 passing through a respective aperture 815 and physically engaging a respective passage 340 as described above) to form a housing around a portion of the flexible circuit 330. In some embodiments, the second portion 800 can be configured to receive the first portion 600. For example, the first seat housing 802 can be configured to have a substantially planar top surface. Ribs 830 can be configured to extend vertically from opposing sides of the first seat housing 802 such that each rib 830 is positioned adjacent to aperture 815.

In some embodiments, each rib 830 can be configured to be a substantially D-shaped member extending from the top surface of the first seat housing 802. For example, each rib 830 can be configured to have a convexed outer lateral surface and a substantially planar inner lateral surface (i.e., facing the center of the top surface of the first seat housing 802) such that the outer lateral surface can be oriented superficially relative to the periphery of the first seat housing 802 and the inner lateral surface can be oriented relative to the nearest aperture 815. In some embodiments, the top surface of each rib 830 can be configured to include a flange that extends along the top periphery of the outer lateral surface. For example, the flange can be configured to rest on the shelf formed by the inner surface of a coupling element 610 when the first portion 600 and the second portion 800 are coupled together.

Figure 9:
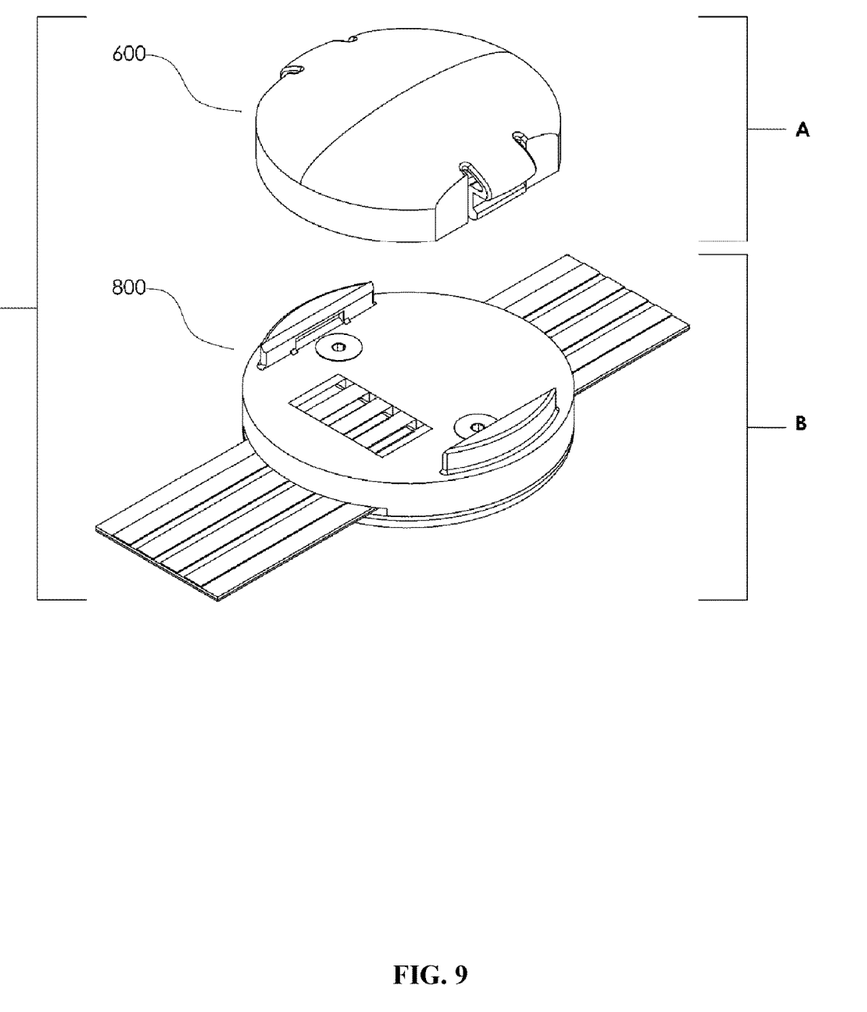
FIG. 9 illustrates an interconnect, in accordance with some embodiments.

In some embodiments, the lateral wall of the first seat housing 802 can include adjacent longitudinal co-extensive lateral recesses configured to flank the conductive trace 335. In some embodiments, the first seat housing 802 can be configured to have an opening 825 that extends completely through the surface thereof (e.g., as described above). Opening 825 can be configured to receive conducting elements 340 as discussed above relative to opening 325. For example, opening 825 can be configured to position guide 340 such that each of the conducting elements 342 are conductively coupled to a respective conductive trace 335. FIG. 9 illustrates an exemplary manner by which the first portion 600 and the second portion 800 can be coupled together to form the interconnect 900.

The control circuits 130 can be configured to include one or more sensors, thermometers, I/O devices, A/V components, and communication units. For example, the control circuit 130 can be configured to measure and/or detect one or more molecules (e.g., hazardous and non-hazardous molecules, including but not limited to, methane, propane, oxygen, $CO_2$, CO, $H_2O$ (i.e. humidity) and chlorine). The control circuit 130 can be configured to monitor and/or detect orientation and/or acceleration. The control circuit 130 can be configured to include one or more proximity sensors to determine proximity of the control circuit relative to one or more objects (e.g., to determine water level, locate studs, or automatically map a particular area within a threshold distance relative to the control circuit 130).

The control circuit 130 can be configured to communicate with another control circuit. The control circuit 130 can be configured to comprise one or more data stores (e.g., for storage of data generated by the control circuit 130 and/or data received from another control circuit). For example, the control circuit may comprise one or more communications modules that are configured to utilize one or more communications protocols and frequencies to communicate with one or more other control circuits, including but not limited to, Wi-Fi, LTE, and SATCOM, C-band, X-band, Ku-band, Ka-band, VHF, UHF, similar communications protocols, similar frequencies, or a combination of two or more thereof. In some embodiments, the control circuit 130 can include one or more antennas. In some embodiments, the control circuit 130 can be conductively coupled to one or more external antennas via one or more conductive traces 335.

As various modifications could be made in the constructions and methods herein described and illustrated without departing from the scope of the invention, it is intended that all matter contained in the foregoing description or shown in the accompanying drawings shall be interpreted as illustrative rather than limiting. Thus the breadth and scope of the present invention should not be limited by any of the above-described exemplary embodiments, but should be defined only in accordance with the following claims appended hereto and their equivalents.

What is claimed is:

1. An interconnect apparatus comprising
   a first portion housing a control circuit;
   a second portion conductively coupled to a flexible circuit, the second portion comprising a first seat housing and a second seat housing, the first seat housing coupled to the second seat housing thereby forming a housing around a portion of the flexible circuit, the control circuit conductively couples to the flexible circuit when the first portion couples to the second portion; and
   wherein
      the flexible circuit is included in an apparel item and comprises a conductive trace;
      the control circuit comprises an electronic component conductively coupled to the conductive trace;
      the conductive trace comprises a conductive composition;
      the first seat housing comprising a lateral wall and a flange extending peripherally from the lateral wall; and
      the flange comprising a longitudinal co-extensive lateral recess flanking the flexible circuit.

2. The interconnect apparatus of claim 1, wherein the conductive composition comprises a polymer and fully exfoliated single sheets of graphene.

3. The interconnect apparatus of claim 1, wherein the electronic component comprises at least one of a resistor, a transistor, a capacitor, an inductor, and a diode.

4. The interconnect apparatus of claim 1, wherein
   the second portion comprises a guide, the guide comprises a conducting element;
   the first seat housing comprises a void exposing a portion of the flexible circuit, the void configured to receive the guide; and
   the conducting element conductively couples to the flexible circuit and the control circuit when the first portion couples to the second portion.

5. The interconnect apparatus of claim 1, wherein
   the first seat housing comprises a component extending vertically from a top surface of the first seat housing;
   the component comprising a convexed outer lateral surface and a substantially planar inner lateral surface oriented superficially relative to a periphery of the first seat housing;
   the first portion comprises a housing shell and a support plate, the housing shell selectively coupled to the support plate;
   the housing shell comprises a shelf spaced laterally inward from a lateral wall of the housing shell thereby forming a front-to-rear gap therebetween;
   the shelf receives the control circuit;
   the component comprises a flange extending along a top periphery of the outer lateral surface; and
   the flange is positioned on the shelf when the first portion engages the second portion.

6. The interconnect apparatus of claim 1, wherein the conductive trace is conductively coupled to an antenna element.

7. The interconnect apparatus of claim 1, wherein the control circuit comprises an antenna element.

8. The interconnect apparatus of claim 1, wherein
   the first portion and the second portion comprise a first interengaging element and a second interengaging element, respectively; and
   the first interengaging element and the second interengaging element are configured to engage each other and thereby orient the first portion relative to the second portion.

9. The interconnect apparatus of claim 1, wherein the control circuit comprises a sensor and is configured to:
   capture, using the sensor, data associated with a molecule; and
   one or more of detect and measure, using the data, a molecule.

10. The interconnect apparatus of claim 9, wherein the molecule comprises one or more of methane, propane, oxygen, carbon dioxide, carbon monoxide, water, and chlorine.

11. The interconnect apparatus of claim 1, wherein the control circuit comprises a sensor and is configured to:
   capture, using the sensor, proximity data of the control circuit relative to an object; and
   determine, using the proximity data, a proximity of the control circuit relative to the object.

12. The interconnect apparatus of claim 1, wherein
   the control circuit comprises a communication module that utilizes a communications protocol; and
   the control circuit is configured to communicate, using the communications module, with a second control circuit.

13. The interconnect apparatus of claim 1, wherein the first portion and the second portion couple together via a snap action.

14. The interconnect apparatus of claim 1, where the first portion selectively couples to the second portion.

* * * * *